(12) United States Patent
Walker et al.

(10) Patent No.: US 7,838,937 B1
(45) Date of Patent: Nov. 23, 2010

(54) CIRCUITS PROVIDING ESD PROTECTION TO HIGH VOLTAGE LATERALLY DIFFUSED METAL OXIDE SEMICONDUCTOR (LDMOS) TRANSISTORS

(75) Inventors: Andrew J. Walker, Mountain View, CA (US); Helmut Puchner, Santa Clara, CA (US); Harold M. Kutz, Snoqualmie, WA (US); James H. Shutt, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 526 days.

(21) Appl. No.: 11/234,255

(22) Filed: Sep. 23, 2005

(51) Int. Cl.
*H01L 23/62* (2006.01)
(52) U.S. Cl. .................. 257/355; 257/357; 257/360; 257/E29.005; 257/E29.018; 257/E21.345; 257/E21.618; 257/E27.031; 257/E29.062; 257/E29.064
(58) Field of Classification Search .............. 257/355, 257/357, 360
See application file for complete search history.

(56) References Cited

U.S. PATENT DOCUMENTS

| 4,990,802 | A | | 2/1991 | Smooha |
| 5,019,888 | A | | 5/1991 | Scott et al. |
| 5,043,782 | A | | 8/1991 | Avery |
| 5,140,401 | A | | 8/1992 | Ker et al. |
| 5,157,573 | A | | 10/1992 | Lee et al. |
| 5,173,755 | A | | 12/1992 | Co |
| 5,182,220 | A | * | 1/1993 | Ker et al. ............ 438/200 |
| 5,218,222 | A | | 6/1993 | Roberts |
| 5,237,395 | A | | 8/1993 | Lee |
| 5,264,723 | A | | 11/1993 | Strauss |
| 5,289,334 | A | | 2/1994 | Ker et al. |
| 5,329,143 | A | | 7/1994 | Chan et al. |
| 5,444,400 | A | | 8/1995 | Hall |
| 5,576,557 | A | | 11/1996 | Ker et al. |
| 5,591,992 | A | | 1/1997 | Leach |
| 5,602,404 | A | | 2/1997 | Chen |
| 5,625,522 | A | | 4/1997 | Watt |
| 5,640,299 | A | | 6/1997 | Leach |
| 5,670,799 | A | | 9/1997 | Croft |
| 5,671,111 | A | | 9/1997 | Chen |
| 5,675,469 | A | | 10/1997 | Racino et al. |
| 5,682,047 | A | | 10/1997 | Consiglio et al. |

(Continued)

OTHER PUBLICATIONS

Duvvury et al., "Device Integration for ESD Robustness of High Voltage Power MOSFETs," © 1994 IEEE, 4 pgs.

(Continued)

*Primary Examiner*—Lynne A Gurley
*Assistant Examiner*—Meiya Li

(57) ABSTRACT

Circuits including a laterally diffused output driver transistor and a distinct device configured to provide electrostatic discharge (ESD) protection for the laterally diffused output driver transistor are presented. In general, the device configured to provide ESD protection includes a drain extended metal oxide semiconductor transistor (DEMOS) transistor configured to breakdown at a lower voltage than a breakdown voltage of the laterally diffused output driver transistor. The laterally diffused output driver transistor may be a pull-down or a pull-up output driver transistor. The device also includes a silicon controlled rectifier (SCR) configured to inject charge within a semiconductor layer of the circuit upon breakdown of the DEMOS transistor. Moreover, the device includes a region configured to collect the charge injected from the SCR and further includes an ohmic contact region configured to at least partially affect the holding voltage of the SCR.

17 Claims, 2 Drawing Sheets

U.S. PATENT DOCUMENTS

| | | | | |
|---|---|---|---|---|
| 5,719,733 | A * | 2/1998 | Wei et al. | 361/56 |
| 5,754,380 | A * | 5/1998 | Ker et al. | 361/56 |
| 5,784,242 | A | 7/1998 | Watt | |
| 5,825,600 | A | 10/1998 | Watt | |
| 6,016,002 | A * | 1/2000 | Chen et al. | 257/546 |
| 6,066,879 | A * | 5/2000 | Lee et al. | 257/355 |
| 6,169,309 | B1 * | 1/2001 | Teggatz et al. | 257/328 |
| 6,281,527 | B1 | 8/2001 | Chen | |
| 6,365,940 | B1 * | 4/2002 | Duvvury et al. | 257/356 |
| 6,433,368 | B1 * | 8/2002 | Vashchenko et al. | 257/173 |
| 6,523,266 | B2 | 2/2003 | Yang | |
| 6,548,874 | B1 | 4/2003 | Morton et al. | |
| 6,576,934 | B2 * | 6/2003 | Cheng et al. | 257/107 |
| 6,642,088 | B1 | 11/2003 | Yu | |
| 6,696,708 | B2 * | 2/2004 | Hou et al. | 257/173 |
| 6,924,531 | B2 * | 8/2005 | Chen et al. | 257/336 |
| 7,375,398 | B2 | 5/2008 | Wang et al. | |
| 7,659,558 | B1 | 2/2010 | Walker et al. | |
| 2002/0081783 | A1 * | 6/2002 | Lee et al. | 438/133 |
| 2004/0004231 | A1 * | 1/2004 | Peng et al. | 257/197 |
| 2004/0033666 | A1 * | 2/2004 | Williams et al. | 438/297 |
| 2005/0151160 | A1 * | 7/2005 | Salcedo et al. | 257/173 |
| 2005/0173765 | A1 * | 8/2005 | Kim | 257/356 |
| 2005/0174142 | A1 * | 8/2005 | Jeon et al. | 326/23 |
| 2005/0254189 | A1 * | 11/2005 | Wu et al. | 361/56 |
| 2005/0275029 | A1 | 12/2005 | Watt | |
| 2006/0006462 | A1 * | 1/2006 | Chang et al. | 257/341 |
| 2006/0274465 | A1 * | 12/2006 | Wu et al. | 361/56 |
| 2007/0069310 | A1 * | 3/2007 | Song et al. | 257/409 |

OTHER PUBLICATIONS

Lee et al., "Novel ESD Protection Structure with Embedded SCR LDMOS for Smart Power Technology," 40th Annual International Reliability Physics Symposium, 2002, pp. 156-161.

USPTO Notice of Allowance for U.S. Appl. No. 11/233,959 dated Sep. 30, 2009; 7 pages.

USPTO Notice of Allowance for U.S. Appl. No. 11/233,959 dated Jun. 3, 2009; 7 pages.

USPTO Non-Final Rejection for U.S. Appl. No. 11/233,959 dated Nov. 21, 2008; 7 pages.

USPTO Requirement for Restriction/Election for U.S. Appl. No. 11/233,959 dated Jun. 3, 2008; 6 pages.

USPTO Requirement for Restriction/Election for U.S. Appl. No. 11/233,959 dated Apr. 4, 2008; 6 pages.

USPTO Notice of Allowance for U.S. Appl. No. 08/845,302 dated May 19, 1998; 2 pages.

USPTO Non-Final Rejection for U.S. Appl. No. 08/845,302 dated Feb. 6, 1998; 9 pages.

Duvvury et al., "ESD Phenomena and Protection Issues in CMOS Output Buffers," 1987; pp. 174-180; 4 pages.

Duvvury et al., "Internal Chip ESD Phenomena Beyond the Protection Circuit," 1988; pp. 2133-2138; 6 pages.

Polgreen et al., "Improving the ESD Failure Threshold of Silicided nMOS Output Transistors by Ensuring Uniform Current Flow," 1989; pp. 167-174; 8 pages.

Duvvury et al., "Achieving Uniform nMOS Device Power Distribution for Sub-micron ESD Reliability," 1992; 92-131 through 92-134; 4 pages.

Steven H. Voldman, "ESD Protection in a Mixed Voltage Interface and Multi-Rail Disconnected Power Grid Environment in 0.50- and 0.25-um Channel Length CMOS Technologies," 1995; 94-125 through 94-134; 10 pages.

Dabral et al., "Core Claps for Low Voltage Technologies," 1994; 94-141 through 94-149; 9 pages.

Voldman et al., "Mixed-Voltage Interface ESD Protection Circuits for Advance Microprocessors in Shallow Trench and LOCOS Isolation CMOS Technologies," 1994; 94-277 through 94-280; 4 pages.

Jaffe et al., "Electrostatic Discharge Protection in a 4-MBIT Dram," 1990; pp. 1-6; 6 pages.

LeBlanc et al., "Proximity Effects of 'Unused' Output Buffers on ESD Performance," 1991; pp. 327-330; 4 pages.

Worley et al., "Sub-Micron Chip ESD Protection Schemes which Avoid Avalanching Junction," 1995; 95-13 through 95-20; 8 pages.

Chatterjee et al., "A Low-Voltage Triggering SCR for On-Chip ESD Protection at Output and Input Pads," 1991; pp. 21-22; 2 pages.

USPTO Notice of Allowance for U.S. Appl. No. 08/297,629 dated Oct. 28, 1996; 8 pages.

USPTO Final Rejection for U.S. Appl. No. 08/297,629 dated Jun. 10, 1996; 6 pages.

USPTO Non-Final Rejection for U.S. Appl. No. 08/297,629 dated Sep. 12, 1995; 8 pages.

USPTO Notice of Allowance for U.S. Appl. No. 08/758,336 dated Dec. 4, 1997; 2 pages.

USPTO Non-Final Rejection for U.S. Appl. No. 08/758,336 dated Aug. 13, 1997; 6 pages.

Tandan, "ESD Trigger Circuit," EOS/ESD Symposium 1994, pp. 94-120 through 94-124; 5 pages.

Merrill et al., "ESD Design Methodology," EOS/ESD Symposium 1993, pp. 93-233 through 93-237; 5 pages.

van Roozendaal et al., "Standard ESD Testing of Integrated Circuits," 1990 EOS/ESD Symposium Proceedings, pp. 119-130; 12 pages.

Watt et al., "A Hot-Carrier Trigger SCR for Smart Power Bus ESD Protection," Cypress Semiconductor Corporation, 1995 IEEE Electron Device Letters, vol. 12, No. 1, Jan. 1991; 4 pages.

* cited by examiner

CIRCUITS PROVIDING ESD PROTECTION TO HIGH VOLTAGE LATERALLY DIFFUSED METAL OXIDE SEMICONDUCTOR (LDMOS) TRANSISTORS

BACKGROUND OF THE INVENTION

1. Field of the Invention

The present invention relates generally to devices and circuits providing electrostatic discharge (ESD) protection, and more particularly, to devices and circuits providing ESD protection to high voltage laterally diffused metal oxide semiconductor (LDMOS) transistors.

2. Description of the Related Art

The following descriptions and examples are given as background information only.

As is well known in the microelectronics industry, integrated circuit devices are susceptible to damage from application of excessive voltages, such as, for example, electrostatic discharge (ESD) events. In particular, during an ESD event, charge transferred within a circuit can develop voltages that are large enough to break down insulating films (e.g., gate oxides) on the device or dissipate sufficient energy to cause electrothermal failures in the device. Such failures include contact spiking, silicon melting, or metal interconnect melting. As such, protection circuits are often connected to I/O bonding pads of an integrated circuit to safely dissipate energy associated with ESD events away from active circuitry. Protection circuits may also be connected to power supply pads or between power supply buses to prevent damage to active circuitry. In developing effective ESD protection circuitry, circuit designers may, however, be limited with regard to the particular structures used, since the protection circuit must integrate well with the remainder of the integrated circuit. For instance, integrated circuits which operate with applications of high voltages (i.e., $V_{DD}$>12 volts) generally need protection circuitry configured to accommodate high voltage levels.

A transistor structure often used for high voltage applications is a drain extended metal oxide semiconductor (DEMOS) transistor, which may also be referred to in the microelectronics industry as a laterally diffused metal oxide semiconductor (LDMOS) transistor. DEMOS transistors differ from other MOS transistors in that the drain contact region is laterally displaced apart from the channel of the transistor at a greater distance than the source contact region of the transistor. As a consequence of the additional voltage drop in the drain extension region, the voltage across the channel of the DEMOS transistor is lower than a transistor having a drain contact region closer to the channel and, in turn, the electric field across the gate oxide is lower. Although DEMOS transistors are effective for operations at high voltage levels, DEMOS transistors are inherently susceptible to damage from ESD events due to their device structure.

One approach in providing ESD protection for integrated circuits having DEMOS transistors is to employ a silicon controlled rectifier (SCR) type structure for transferring charge away from the transistor. For example, some conventional designs incorporate SCRs within active DEMOS transistors of an integrated circuit (i.e., transistors used for operations of a device other than protection from ESD events). Such a configuration, however, relies on drain breakdown of the active DEMOS transistor to trigger the SCR. In some cases, triggering the SCR in such a manner may not be fast enough to prevent the active DEMOS transistor from being damaged and, therefore, may not be effective for many applications. In other embodiments, an SCR may be incorporated within protection circuitry coupled to I/O bonding pads of an integrated circuit. In some cases, a protection-designated DEMOS transistor may further be included in the protection circuitry to trigger the SCR. In general, however, such configurations have limited controllability of the trigger and holding voltages of the SCR. As a consequence, the level of ESD protection offered by such prior art designs is limited.

Accordingly, it would be beneficial to develop an improved ESD protection circuit suitable for use with an integrated circuit utilizing high voltage drain extended MOS transistors. In particular, it would be advantageous to develop an ESD protection device that allows the trigger voltage of an incorporated SCR to be set without affecting the operation of the laterally diffused output driver transistor which it is configured to protect. In addition, it would be valuable to arrange such a protection device in a variety of manners within an integrated circuit such that energy associated with ESD events may be safely dissipated from different types of active circuit devices, including but not limited to pull down output transistors and/or pull up output transistors.

SUMMARY OF THE INVENTION

The problems outlined above may be in large part addressed by a circuit providing ESD protection to high voltage laterally diffused metal oxide semiconductor (LDMOS) transistors. The following are mere exemplary embodiments of the circuit and are not to be construed in any way to limit the subject matter of the claims.

One embodiment of the circuit includes an output driver transistor with an extended drain contact region and a distinct device configured to provide electrostatic discharge (ESD) protection for the output driver transistor. The distinct device includes an ESD protection transistor with an extended drain contact region and further includes a silicon controlled rectifier (SCR) with a first terminal spaced apart from the extended drain contact region of the ESD protection transistor and a second terminal dually serving as a source contact region of the ESD protection transistor. Moreover, the distinct device includes an ohmic contact region spaced apart from the first terminal of the SCR and a collection region arranged adjacent to the second terminal of the SCR.

Another embodiment of the circuit includes a laterally diffused pull-down output driver transistor and a device configured to provide electrostatic discharge protection for the laterally diffused output pull-down driver transistor. The device includes a drain extended metal oxide semiconductor transistor (DEMOS) transistor configured to breakdown at a lower voltage than a breakdown voltage of the laterally diffused pull-down output driver transistor. In addition, the device includes a silicon controlled rectifier (SCR) configured to generate charge within a semiconductor layer of the circuit upon breakdown of the DEMOS transistor, an ohmic contact region configured to at least partially affect the holding voltage of the SCR, and a region configured to collect the charge generated from the SCR.

Another embodiment of the circuit includes a laterally diffused pull-up output driver transistor and a core clamp configured to provide electrostatic discharge protection for the laterally diffused output pull-up driver transistor. The core clamp includes a drain extended metal oxide semiconductor transistor (DEMOS) transistor configured to breakdown at a lower voltage than a breakdown voltage of the laterally diffused pull-up output driver transistor. In addition, the core clamp includes a silicon controlled rectifier (SCR) configured to generate charge within a semiconductor layer of the device upon breakdown of the DEMOS transistor, an ohmic contact region configured to at least partially affect the holding voltage of the SCR, and a region configured to collect the charge generated from the SCR.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
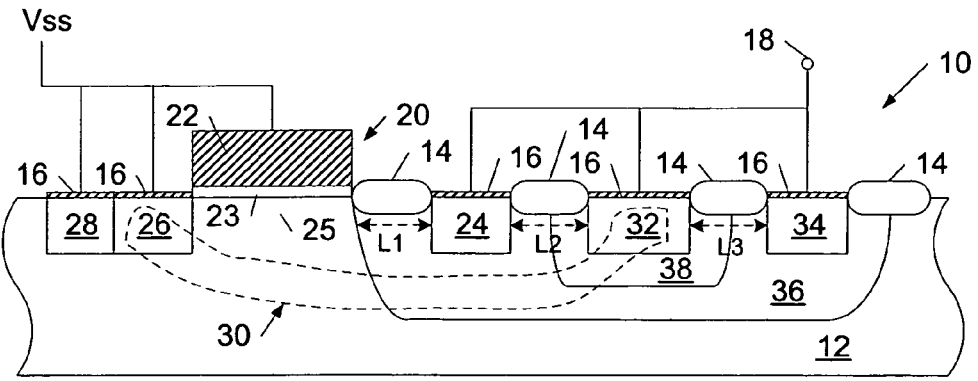
FIG. 1 is an exemplary cross-sectional view of a semiconductor structure configured to provide protection from electrostatic discharge (ESD)

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 3:
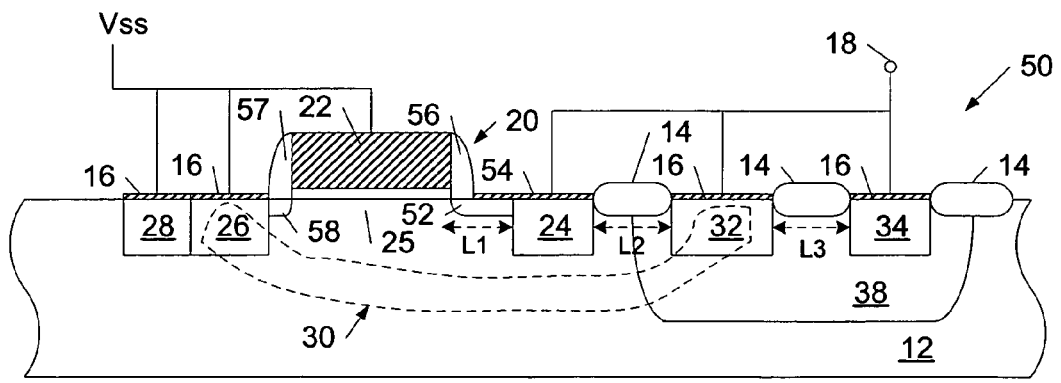
FIG. 3 is an exemplary cross-sectional view of another alternative semiconductor structure configured to provide ESD protection.
Figure 4:
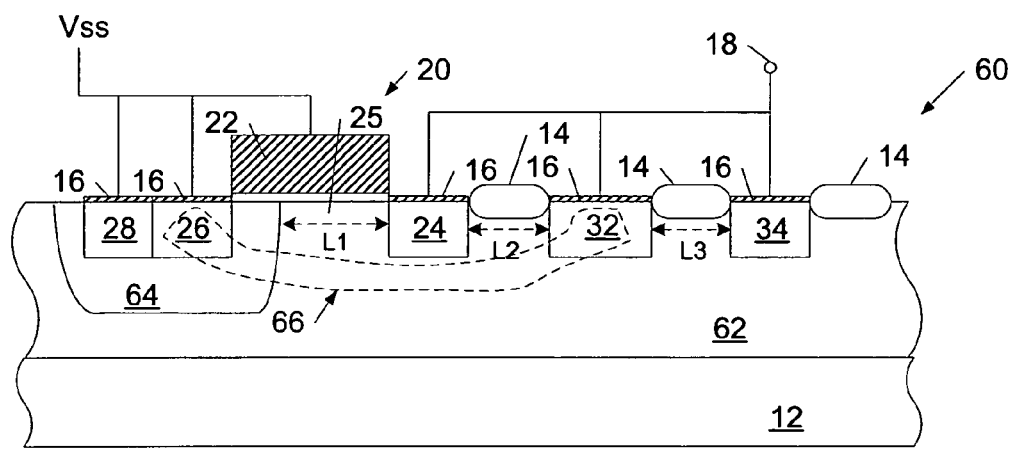
FIG. 4 is an exemplary cross-sectional view of yet another alternative semiconductor structure configured to provide ESD protection.
Figure 5:
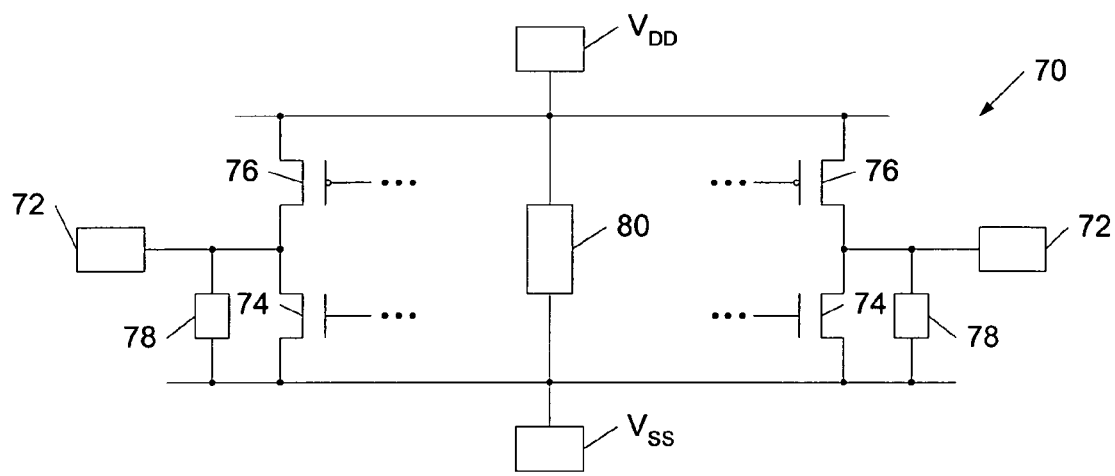
FIG. 5 is a schematic of an exemplary circuit depicting an arrangement of one or more of the semiconductor structures depicted in FIGS. 1-4 in positions relative to output driver transistors, signal pads, and power supply pads of the circuit.

Turning to the drawings, exemplary devices for protecting laterally diffused metal oxide semiconductor (LDMOS) output driver transistors from damage caused by electrostatic discharge (ESD) events are illustrated in FIGS. 1-4. More specifically, cross-sectional views of exemplary semiconductor topographies, which are configured to divert charge from a bus coupled to an active LDMOS output driver transistor (i.e., a LDMOS pull-down output driver transistor or a LDMOS pull-up output driver transistor), are shown in FIGS. 1-4. In addition, FIG. 5 illustrates a schematic of an exemplary circuit detailing an arrangement of one or more of the semiconductor topographies depicted in FIGS. 1-4 in positions relative to output driver transistors, signal pads, and power supply pads of the circuit. As discussed in reference to FIG. 5, the ESD protection devices described herein are distinct from the active LDMOS output driver transistors they are used to protect and, as such, the protection devices do not rely on the operation or, more specifically, the avalanche of the active LDMOS output driver transistors.

As noted above, a LDMOS transistor (i.e., regardless of whether the transistor is used as an active transistor or as protection circuitry) is a MOS transistor having a drain contact region that is laterally displaced apart from the channel of the transistor at a greater distance than the source contact region is relative to the channel. Such a configuration may be implemented in a variety of manners, some examples of which are shown and described below in reference to FIGS. 1-4. As noted above, an LDMOS transistor may be alternatively referenced as a drain extended MOS (DEMOS) transistor and, as such, the terms DEMOS and LDMOS are used interchangeably herein. For simplifying the distinction between the transistor used as an output driver and the transistor configured to provide ESD protection of the output driver in the circuits described herein, the following may generally reference output driver transistors as LDMOS transistors and ESD protection transistors as DEMOS transistor. Such nomenclature, however, may be reversed in some cases and, therefore, the references of such transistors are not so limited. It is noted that the components illustrated in FIGS. 1-5 are not necessarily drawn to scale. Rather, FIGS. 1-5 are used to emphasize the relative arrangement and connections between components to provide an ESD protection circuit for an active LDMOS output driver transistor.

FIG. 1 illustrates a cross-sectional view of ESD protection device 10 including DEMOS transistor 20, silicon controlled rectifier (SCR) 30, ohmic contact region 34, and collection region 28. As will be described in more detail below, such components are collectively configured and arranged to transfer charge from a bus coupled to node 18 to a bus coupled to low power supply Vss. The bus coupled to node 18 is coupled to an active LDMOS output driver transistor of an integrated circuit (i.e., a LDMOS output transistor distinct from DEMOS transistor 20 and used for operation of an integrated circuit other than for ESD protection). As such, diverting charge from the bus coupled to node 18 will prevent excessive charge from accessing the active LDMOS output driver transistor.

As shown in FIG. 1, DEMOS transistor 20 includes gate 22 and gate oxide 23 disposed above semiconductor layer 12. The materials and dimensional characteristics of gate 22, gate oxide 23, and semiconductor layer 12 may include any of those known in the semiconductor fabrication industry for DEMOS transistors. For instance, semiconductor layer 12 may be a relatively lightly doped substrate or epitaxial layer (i.e., doped with a relatively light net concentration of electrically active p-type impurities or n-type impurities) and, thus, may have a relatively low degree of conductivity. For example, a doping level of semiconductor layer 12 may be generally less than or equal to approximately $1.0 \times 10^{19}$ cm$^{-3}$, more specifically between approximately $1.0 \times 10^{13}$ cm$^{-3}$ and approximately $1.0 \times 10^{17}$ cm$^{-3}$, and in some embodiments between about $1.0 \times 10^{14}$ cm$^{-3}$ and about $1.0 \times 10^{16}$ cm$^{-3}$.

As shown in FIG. 1, DEMOS transistor 20 further includes drain contact region 24 and source contact region 26 disposed within semiconductor layer 12 on opposing sides of gate 22. As used herein, the terms "drain contact region" and "source contact region" may generally refer to the diffusion regions within the semiconductor substrate at which contact is made to allow current flow to and from the transistor. In some embodiments, cladding layer 16 may be formed over such regions, as well as over other ohmic contact regions of ESD protection device 10, to improve the electrical conductivity of connections thereto. Due to the specific reference of contact being made to the regions, the terms "drain contact region" and "source contact region" do not generally include lighter doped shallow regions which are sometimes interposed between drain and source contact regions and respective sidewalls of the gate to reduce hot carrier effects of the gate dielectric. Rather, such lighter doped shallow regions are generally protected from contact by overlying spacer structures aligned with the sidewalls of the gate. It is noted that any of the configurations of DEMOS transistors described herein (i.e., those transistors included in devices which are configured to provide active LDMOS output driver transistors protection from ESD events) may include sidewall spacers and/or lightly doped shallow regions extending from gate sidewalls and, consequently, the ESD protection devices described herein are not necessarily limited to the illustrations of FIGS. 1-4. For instance, ESD protection device 10 may, in some embodiments, include sidewall spacers and/or lightly doped shallow regions extending from the sidewalls of gate 22 with respect to either or both of drain and source contact regions 24 and 26.

In any case, drain contact region 24 and source contact region 26 may each include a net concentration of electrically active dopants opposite in conductivity type to semiconductor layer 12. In other embodiments, drain contact region 24 and source contact region 26 may be of the same conductivity type as semiconductor layer 12, but may be disposed within a well region of opposite conductivity type. In such cases, drain contact region 24 may be further disposed within well region 36 as described in reference to FIGS. 1 and 2. In yet other embodiments, drain contact region 24 and source contact region 26 may be formed within an epitaxial layer arranged upon semiconductor layer 12 with the epitaxial layer of the same conductivity type as regions 24 and 26 and of opposite conductivity type as semiconductor layer 12. In such cases, source contact region 26 is further formed within a well region of opposite conductivity type to the epitaxial layer. An example of such a configuration is shown in FIG. 4 and described in more detail below. In any case, the conductivity type of drain and source contact regions 24 and 26 may define the conductivity type of the DEMOS transistor fabricated therefrom. In particular, n-type drain and source contact regions form an n-type DEMOS (DENMOS) transistor and p-type drain and source contact regions form a p-type DEPMOS (DEPMOS) transistor.

In general, DEMOS transistor 20 may be of the same conductivity type as the LDMOS output driver transistor it is configured to protect from ESD events. As such, the conductivity type of drain and source contact regions 24 and 26 may be dependent on the conductivity type of the protected LDMOS output driver transistor of the circuit. As noted above, the ESD protection devices described herein may be configured to protect either LDMOS pull-down output driver transistors or LDMOS pull-up output driver transistors. In general, pull-down and pull-down output driver transistors are of opposite conductivity types. In particular, LDMOS pull-up output driver transistors are commonly configured as p-type and LDMOS pull-down output driver transistors are commonly configured as n-type. As such, the conductivity type of DEMOS transistor 20 may, in some embodiments, depend on the type of the LDMOS output driver transistor being protected.

In either embodiment, drain contact region 24 may be laterally displaced away from channel region 25 at a farther distance than source contact region 26 such that a DEMOS transistor is formed. A channel region may generally refer to the region under gate 22 which is of opposite conductivity type from source and drain contact regions 26 and 24 prior to the application of a threshold voltage to gate 22 and is of the same conductivity type as source and drain contact regions 26 and 24 upon application of threshold voltage to gate 22 allowing the conduction of current through the transistor. In some embodiments, drain contact region 24 may be spaced apart from gate 22 by field oxide isolation structure 14 to displace drain contact region 24 farther away from channel region 25 than source contact region 26 as shown in FIG. 1. In other embodiments, field oxide isolation structure 14 may be omitted from ESD protection circuit 10 and an alternative technique for displacing drain contact region 24 from channel region 25 may be used. Other displacement techniques which may be employed include the use of sidewall spacers or silicide blocking structures along gate 22 as noted in the alternative embodiments of FIGS. 2 and 3. In yet other embodiments, a temporary masking layer may be placed adjacent to gate 22 and dopants may be implanted into the semiconductor topography such that drain contact region 24 is formed in a designated position relative to gate 22.

In some cases, drain contact region 24 may be disposed within a lightly-doped well region of the same conductivity type as the drain contact region, such as noted by well region 36 in FIG. 1. The increased drain-to-substrate junction area provided by well region 36, along with the reduced dopant concentration at the drain-to-substrate junction, greatly increases the junction breakdown voltage, permitting higher voltage operation of the transistor. In particular, well region 36 may be fabricated to extend along the sidewalls of gate 22 or beneath a portion of gate 22 to an isolation region disposed on the outlying side of drain contact region 24 such that drain contact region 24 is enveloped therein. In other embodiments, well region 36 may be extended to additionally envelop one or both of ohmic contact regions 32 and 34 as shown in FIG. 1, for example. In either case, well region 36 may have a doping level less than drain contact region 24, such as between approximately $1.0 \times 10^{16}$ and approximately $5.0 \times 10^{18}$ cm$^{-3}$, more specifically between approximately $5.0 \times 10^{16}$ and approximately $1.0 \times 10^{18}$ cm$^{-3}$, and in some embodiments around $2.0 \times 10^{17}$ cm$^{-3}$. In contrast, drain contact region 24, as well as source contact region 26, may having a doping level between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some embodiments around $1.0 \times 10^{20}$ cm$^{-3}$.

In general, the breakdown voltage of drain contact region 24 may correspond to the distance the drain contact region is displaced from the channel region beneath gate 22, denoted in FIG. 1 as L1. Consequently, with the incorporation of well region 36 and, in some cases, field oxide isolation structure 14, the breakdown voltage of drain contact region 24 may be set and, in some embodiments, optimized for the operation of ESD device 10. In other cases, well region 36 may be omitted from DEMOS transistor 20. Exemplary configurations of DEMOS transistors without a well region enveloped around drain contact region 24 are shown and described in reference to FIGS. 3 and 4. In any case, it may be advantageous in some embodiments to configure the breakdown of DEMOS transistor 20 at a lower voltage than a breakdown voltage of the active LDMOS output driver transistor ESD protection device 10 is configured to protect. In this manner, ESD protection device 10 may divert the excessive voltage on a bus coupled to the active LDMOS output driver transistor prior to the LDMOS transistor breaking down. As a result, damage to the active LDMOS output driver transistor due to ESD events may be prevented.

As noted above, DEMOS transistors are generally used for operations employing high voltages. In reference to such transistors, the term "high voltage" may generally refer to voltages exceeding approximately 12 volts. As such, DEMOS transistor 20 may generally be configured to breakdown at a voltage exceeding approximately 12 volts and less than the breakdown voltage of the active DEMOS transistor being protected. In general, the ESD protection devices described herein may be configured to protect LDMOS output driver transistors of either conductivity type. In addition, as noted above, the ESD protection devices described herein may be configured to protect either LDMOS pull-down output driver transistors or LDMOS pull-up output driver transistors. Since LDMOS pull-up and pull-down output driver transistors are fabricated of opposite conductivity types and the breakdown voltage of a transistor is generally dependent upon its conductivity type, the voltage at which DEMOS transistor 20 may be configured to breakdown may be dependent on the type of output driver transistor it is employed to protect.

Many active n-type LDMOS (LDNMOS) output driver transistors used in current applications employ an operating range between approximately 36 volts and approximately 40 volts and a breakdown voltage between approximately 60 volts and approximately 65 volts. As such, DEMOS transistor 20 may, in some embodiments, be specifically configured to breakdown between approximately 40 volts and approximately 56 volts and, more specifically, between approximately 44 volts and approximately 56 volts to accommodate such a common configuration of active LDNMOS output driver transistors. LDNMOS transistors are generally used for pull-down output driver transistors and, therefore, such ranges may be particularly applicable in embodiments in which ESD protection device 10 is used to protect a LDNMOS pull-down output driver transistor from ESD events. In other embodiments, however, such ranges may be employed for embodiments in which ESD protection device 10 is used to protect a LDNMOS pull-up output driver transistor from ESD events.

In contrast, many active p-type LDMOS (LDPMOS) output driver transistors used in current applications employ an operating range between approximately 20 volts and approximately 22 volts and breakdown voltage between approximately 45 volts and approximately 50 volts. As such, DEMOS transistor 20 may, in some embodiments, be specifically configured to breakdown between approximately 20 volts and approximately 40 volts and, more specifically, between approximately 30 volts and approximately 40 volts to accommodate such a common configuration of active LDPMOS output driver transistors. LDPMOS transistors are generally used for pull-up output driver transistors and, therefore, such ranges may be particularly applicable in embodiments in which ESD protection device 10 is used to protect a LDPMOS pull-up output driver transistor from ESD events. In other embodiments, however, such ranges may be employed for embodiments in which ESD protection device 10 is used to protect a LDPMOS pull-down output driver transistor from ESD events. The aforementioned breakdown voltage ranges for DEMOS transistor 20 are exemplary and, therefore, do not necessarily limit the ESD protection devices described herein. In particular, DEMOS transistor 20 may be configured to breakdown at higher or lower breakdown voltages than the aforementioned values, depending on the design specifications of the active DEMOS output driver transistor being protected.

An exemplary distance range for L1 to accommodate the breakdown voltages of DEMOS transistor 20 may be between approximately 0.5 micron and approximately 10 microns, depending on the dimensional specifications of gate 22 and gate oxide 23 as well as the doping specifications of drain and source contact regions 24 and 26, well region 36, and semiconductor layer 12. In some embodiments, distances between approximately 1.0 micron and approximately 3.0 microns, or more specifically, around 1.5 microns may be applicable for L1, particularly in embodiments in which DEMOS transistor is of n-type conductivity type. Longer or shorter distances for L1, however, may be employed, depending on the design specifications of the device.

Figure 2:
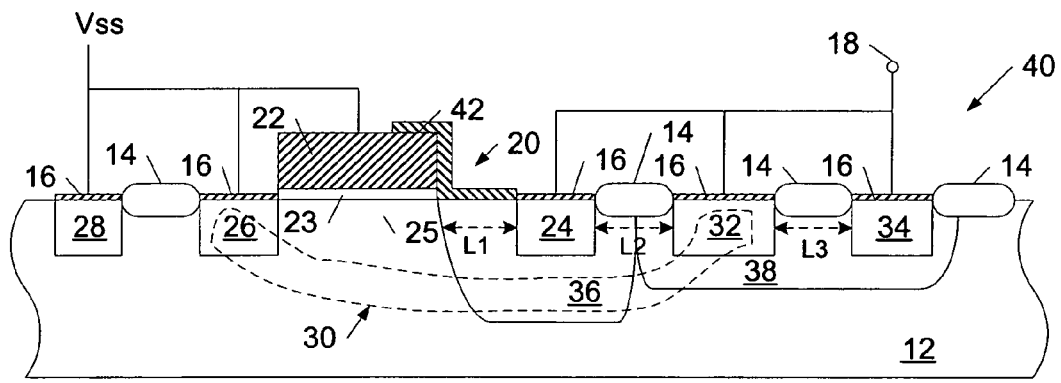
FIG. 2 is an exemplary cross-sectional view of alternative semiconductor structure configured to provide ESD protection.

Spaced adjacent to drain contact region 24 by field oxide isolation structures 14, ESD protection device 10 includes ohmic contact regions 32 and 34. As with drain contact region 24 and source contact region 26, one or both of ohmic contact regions 32 and 34 may include cladding layer 16 thereon to reduce resistance of the connections to the respective power supplies and busses. Ohmic contact region 34 is of the same conductivity type as drain and source contact regions 24 and 26, while ohmic contact region 32 is of the opposite conductivity type. Although it is noted that region 32 comprises a first terminal of SCR 30 and region 26 comprises a second terminal, for sake of brevity, regions 32 and 34 (while different) are henceforth referred to as "ohmic contact region." In general, ohmic contact region 34 may include a concentration level within the range described above for source and drain contact regions 24 and 26. In addition, ohmic contact region 32 may include a concentration level within the range described below for collection region 28. As noted above, ohmic contact regions 32 and 34 may, in some embodiments, be disposed within well region 36 as shown in FIG. 1. In other embodiments, well region 36 may exclude one or both of ohmic contact regions 32 and 34. In such cases, one or both of ohmic contact regions 32 and 34 may be disposed within a separate well region. An exemplary configuration in which ohmic contact regions 32 and 34 are disposed within a different well region than drain contact region 24 is shown in FIG. 2 and described in more detail below. While different, well regions 36 and 38 are nonetheless designated as "well regions." Obviously, well region 36 is an n-well region while region 38 is a p-well region, nonetheless, both are, in fact, well regions and each are therefore designated as such. Reference characters 16 and 54 are each designated as a cladding layer. While each cladding layer resides in different regions and over different ohmic contact regions, regions 16 and 54 are nonetheless both cladding regions or cladding layers.

Regardless of the configuration of well region 36, ESD protection device 10 may, in some embodiments, include well region 38 surrounding ohmic contact region 32. Well region 38 may be of the opposite conductivity type as ohmic contact region 32 and, thus, may be of the same conductivity type as well region 36. Well region 38, however, may differ from well region 36 by having a greater net concentration of impurities, making it slightly more conductive. While different, well regions 36 and 38 are nonetheless designated as well regions. For example, well region 38 may have a doping level between approximately $1.0 \times 10^{17}$ and approximately $1.0 \times 10^{20}$ cm$^{-3}$, more specifically between approximately $1.0 \times 10^{18}$ and approximately $1.0 \times 10^{19}$ cm$^{-3}$, and in some embodiments around $5.0 \times 10^{18}$ cm$^{-3}$. In some embodiments, well region 38 may envelop ohmic contact region 34 in addition or alternative to well region 36. In yet other embodiments, well region 38 may be omitted from ESD protection device 10.

In any case, due to the arrangement of ohmic contact region 32 and well region 36, a pnpn junction is formed among ohmic contact region 32, well region 36, semiconductor layer 12, and source contact region 26. More specifically, a first bipolar transistor (either npn or pnp) is formed by source contact region 26 (emitter/collector), semiconductor layer 12 (base), and well region 36 (collector/emitter). In addition, a second bipolar transistor (either pnp or npn) is formed by ohmic contact region 32 (emitter/collector), well region 36 (base), and semiconductor layer 12 (collector/emitter). Collectively, the bipolar transistors serve as silicon controlled rectifier (SCR) 30. In particular, source contact region 26 and ohmic contact region 32 may serve as cathodes and anodes of SCR 30, respectively or vice versa, depending on the conductivity types of the regions formed within ESD protection device 10. The dotted line in FIG. 1 is used to illustrate the general connection of diffusion regions making up SCR 30 and is not intended to imply a particular boundary of the SCR.

The relative operation of SCR 30 to DEMOS transistor 20 and other components within ESD protection device 10 is described in more detail below, but may generally include the avalanche of drain contact region 24 triggering SCR 30 (i.e., forward bias ohmic contact region 32 to inject charge into semiconductor layer 12). As such, not only does the distance, denoted in FIG. 1 as L1, determine the breakdown voltage of drain contact regions 24, distance L1 can also partially determine the triggering voltage of SCR 30. As a result, the trigger voltage of SCR 30 may be set without affecting the operation of the laterally diffused output driver transistor which it is configured to protect. In addition, the distance between ohmic contact regions 32 and 34, denoted in FIG. 1 as L3, also affects the triggering voltage of SCR 30. Consequently, L3 may be used to set the triggering voltage of SCR 30 at different values relative to a given breakdown voltage of DEMOS transistor 20.

Another parameter of SCR 30 is its holding voltage. In general, the holding voltage of SCR 30 is affected by the total distance between source contact region 26 and ohmic contact region 32. As noted above, L1 corresponds to the breakdown voltage of DEMOS transistor 20 and, therefore, generally has a width set according to the design specifications of the transistor, as are the widths of source and drain contact regions 26 and 24 and channel region 25. In contrast, the distance between drain contact region 24 and ohmic contact region 32, denoted in FIG. 1 as L2, is not generally set by the operational specifications of the transistor and, consequently, L2 may be set to target a particular holding voltage for SCR 30 regardless of the size of DEMOS transistor 20. In other words, L2 may be set to partially affect the holding voltage of SCR 30 by the width of the isolation structure therebetween.

As with L1, exemplary distance ranges for L2 and L3 may be between approximately 0.5 micron and approximately 10 microns, depending on the dimensional and doping specifications of ohmic contact regions 32 and 34 and semiconductor layer 12. In some embodiments, distances between approximately 1.0 micron and approximately 3.0 microns, or more specifically, around 1.5 microns may be particularly applicable for L2 and L3. Longer or shorter distances for L2 and L3, however, may be employed, depending on the design specifications of the device. It is noted that although field oxide isolation structures 14 are shown in FIG. 1 having substantially equal widths, ESD protection device 10 is not necessarily so limited. In particular, each of the field oxide isolation structures 14 may be independently optimized for the operation of ESD protection device 10 and, therefore, one or more of them may differ in size in some embodiments.

The charge injected into semiconductor layer 12 from SCR 30 may be collected at collection region 28, which in turn is coupled to low power supply Vss to dissipate the charge. As with the other contact regions of ESD protection device 10, collection region 28 may, in some embodiments, include cladding layer 16 thereon to reduce resistance of the connections to Vss. Collection region 28 includes the same net conductivity type as ohmic contact region 32 and semiconductor layer 12. In order to generate charge from SCR 30 and pass it to collection region 28, ohmic contact region 32 and collection region 28 may generally be configured to have relatively high conductivity. For instance, ohmic contact region 32 and collection region 28 may include relatively similar or different dopant concentration levels between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some cases about $1.0 \times 10^{20}$ cm$^{-3}$. Although collection region 28 is shown bordering source contact region 26 in FIG. 1, the placement of the region is not necessarily so limited. In particular, collection region 28 may alternatively be spaced apart from source contact region 26 by a portion of semiconductor layer 12 and, in some cases, may be spaced apart from source contact region 26 by a field oxide isolation structure as shown and described in reference to FIG. 2 below.

As shown in FIG. 1, source contact region 26, gate 22, and collection region 28 are coupled to low power supply Vss. In contrast, drain contact region 24 and ohmic contact regions 32 and 34 are coupled to node 18, which in turn is coupled to a bus coupled to a high voltage signal pad or a high voltage power supply. When an integrated circuit including ESD protection device 10 is powered-up, node 18 is essentially between 0 volts and $V_{DD}$ and SCR 30 is initially in a first, high-impedance "OFF" state. In the first state, any voltage that is applied to input pads of the integrated circuit in excess of the high voltage power supply $V_{DD}$ but below the threshold trigger level of DEMOS transistor 20, will not cause large leakage currents to be drawn through ESD protection device 10. Rather, such initial voltages will at most cause relatively small, transient currents to flow through active devices of the integrated circuit to charge the bus coupled to node 18 to a voltage level below the excessive voltage being applied. Subsequent applications of voltages higher than $V_{DD}$ will cause substantially no further input leakage currents to flow. Controlled application of voltages, even in excess of $V_{DD}$, to pins of the device in this context may be considered "normal." However, ESD events are not considered part of the "normal" operation of the device.

In embodiments in which ESD protection device 10 is configured to protect a LDMOS pull-down output driver transistor of a circuit, a subsequent positive polarity ESD event on a high voltage signal pad with respect to Vss will result in the voltage on node 18 increasing with respect to Vss. For voltages below the breakdown voltage of drain contact region 24, the voltage on drain contact region 24 is approximately equal to that on node 18. This approximation is fairly accurate since the current level being drawn from the bus is fairly low. When the voltage on the bus coupled to node 18 reaches the breakdown voltage of drain contact region 24, current begins to flow from drain contact region 24 into well region 36. The current flow causes a voltage drop across well region 36, which in turn forward biases ohmic contact region 32, resulting in an injection of charge (i.e., holes in embodiments in which ohmic contact region 34 is n-type and electrons when ohmic contact region 34 is p-type) into semiconductor layer 12. A similar operation of ESD protection device 10 may be employed for negative polarity ESD events on a high voltage signal pad with respect to $V_{DD}$ in embodiments in which ESD protection device 10 is configured to protect a LDMOS pull-up output driver transistor of a circuit (i.e., when ESD protection device 10 is employed as a core clamp between high and low voltage power supplies of the integrated circuit).

In either case, the injection of the charge from ohmic contact region 32 hastens the transition of SCR 30 into a latched state. In some embodiments, such a low-impedance "ON" state of SCR 30 is characterized by a voltage drop of approximately 7 volts between the bus coupled to node 18 and negative power supply bus Vss, although other values of voltage drops may result. Inasmuch as the injection of charge from ohmic contact region 32 is initiated, the time lag between the occurrence of an ESD event and when SCR 30 turns on becomes sufficiently short to effectively handle relatively fast ESD events, such as ESD events occurring according to the Charged Device Model (CDM) for example. SCR 30 will remain in the low-impedance state until current through either the bipolar transistors of SCR 30 is interrupted. This interruption may occur when all of the charge from the ESD event is transferred from node 18 to Vss. Once the charge transfer is complete, SCR 30 returns to a high-impedance "OFF" state.

Alternative configurations of ESD protection circuits that are adapted to divert charge from a bus coupled to a LDMOS output driver transistor are shown in FIGS. 2-4. In particular, FIGS. 2-4 illustrate alternative configurations of drain extended MOS transistors which may be configured with a plurality of diffusion regions to form an ESD protection device having an SCR configured to trigger upon avalanche of the corresponding DEMOS transistor. As shown in FIGS. 2-4, ESD protection circuits 40, 50, and 60 may include many of the same components as ESD protection circuit 10 in FIG. 1. In particular, the components in FIGS. 2-4 having the same reference numbers as the components shown in FIG. 1 may be substantially similar and, therefore, the description of such components for ESD protection device 10 are referenced for ESD protection devices 40, 50, and 60.

ESD protection circuit 40 in FIG. 2 differs from ESD protection circuit 10 in FIG. 1 by the use of structure 42 along gate 22 and above a portion of well region 36 to extend drain contact region 24 apart from gate 22. Structure 42 includes a dielectric material, such as silicon dioxide or silicon nitride, and, in some embodiments, may be used to prevent the formation of silicide structures along gate 22. ESD protection device 40 further differs from ESD protection device 10 in that collection region 28 is spaced apart from source contact region 26 by field oxide isolation structure 14. In addition, well region 36 does not include ohmic contact regions 32 and 34 in ESD protection device 40 and well region 38 is extended to include ohmic contact region 34. It is noted that the use of structure 42, the alternative placement of collection region 28, the exclusion of ohmic contact regions 32 and 34 within well region 36, and the extension of well region 38 to include ohmic contact region 34 are not mutually exclusive to ESD protection circuit 40 and, therefore, any one or more of such alternative configurations may be incorporated into ESD protection circuit 10 or other embodiments of ESD protection devices described herein.

ESD protection circuit 50 in FIG. 3 differs from ESD protection circuit 10 in FIG. 1 by the exclusion of well region 36 and, instead includes lightly doped shallow region 52 and sidewall spacer 56. ESD protection circuit 50 further includes cladding layer 54 extending over drain contact region 24 and a portion of lightly doped shallow region 52 abut to sidewall spacer 56. Furthermore, ESD protection circuit 50 includes sidewall spacer 57 on the opposing side of gate 22 and also includes lightly doped shallow region 58 displacing source contact region 26 from gate 22. In some embodiments, lightly doped shallow regions 52 and 58 may include substantially similar concentrations. In other embodiments, however, lightly doped shallow region 52 may include a smaller net concentration of impurities than lightly doped shallow region 58. In yet other embodiments, any combination of the components described in reference to FIGS. 1-3 may be used to extend a drain contact region from a gate to form a DEMOS transistor. For example, both a silicide blocking structure and a lightly doped shallow region may be used to extend drain contact region 24 from gate 22. In other embodiments, spacer 56 and extended cladding layer 54 may be formed over drain contact region 24 while disposed within well region 36.

FIG. 4 illustrates ESD protection device 60 including a different configuration of well regions and further illustrates the arrangement of such well regions as well as drain and source contact regions 24 and 26 and ohmic contact regions 32 and 34 within a semiconductor layer of an opposite conductivity type than described in reference to FIGS. 1-3. In particular, FIG. 4 illustrates ESD protection device 60 including semiconductor layer 62 arranged above semiconductor layer 12 and doped of the same conductivity type as drain and source contact regions 24 and 26 as well as ohmic contact region 34. In general, semiconductor layer 62 may include a doping concentration in the range described for well region 36. Well regions 36 and 38 have been omitted from ESD protection device 60, but well region 64 of the same conductivity type as collection region 28 and ohmic contact region 32 is shown surrounding source contact region 26 and collection region 28.

As a result, a pnpn junction is formed among source contact region 26, well region 64, semiconductor layer 62, and ohmic contact region 32. More specifically, a first bipolar transistor (either npn or pnp) is formed by source contact region 26 (emitter/collector), well region 64 (base), and semiconductor layer 62 (collector/emitter). In addition, a second bipolar transistor (either pnp or npn) is formed by ohmic contact region 32 (emitter/collector), semiconductor layer 62 (base), and well region 64 (collector/emitter). Collectively, the bipolar transistors serve as silicon controlled rectifier (SCR) 66. In particular, source contact region 26 and ohmic contact region 32 may serve as cathodes and anodes of SCR 66, respectively or vice versa, depending on the conductivity types of the regions formed within ESD protection device 60. The dotted line in FIG. 1 is used to illustrate the general connection of diffusion regions making up SCR 66 and is not intended to imply a particular boundary of the SCR.

As noted above, the ESD protection devices described herein may be incorporated to protect either pull-up or pull-down LDMOS output driver transistors. FIG. 5 illustrates a schematic of an exemplary circuit outlining the arrangement of one or more of the ESD protection devices described herein relative to output driver transistors, signal pads, and power supply pads of the circuit. In particular, FIG. 5 illustrates circuit 70 having ESD protection device 78 arranged in parallel with LDMOS pull-down transistor 74. In such a configuration, a positive zap on high voltage signal pad 72 with respect to low power supply Vss will prompt ESD protection device 78 to trigger prior to LDMOS pull-down transistor 74 and thus divert excessive voltage on the bus common to both devices. In addition, the inclusion of ESD protection device 80 along the bus between high voltage power supply VDD and low voltage power supply Vss may divert ESD current away from pull-up LDMOS transistor 76 when a negative zap on high voltage signal pad 72 with respect to high voltage power supply $V_{DD}$ occurs.

In general, ESD protection devices 78 and 80 may include any of the configurations described in reference to FIGS. 1-4. In some embodiments, ESD protection devices 78 and 80 may include the same configuration. In other embodiments, ESD protection devices 78 and 80 may include different configurations. In yet other embodiments, one of ESD protection devices 78 and 80 may be omitted from circuit 70. In such cases, alternative ESD protection devices may, in some embodiments, be incorporated onto the I/O signal pads of circuit 70. The continuation dots extending from pull-down output DEMOS transistors 74 and pull-up DEMOS transistors 76 indicate routings extending to circuitry internal to circuit 70.

It will be appreciated to those skilled in the art having the benefit of this disclosure that this invention is believed to provide devices for protecting LDMOS output drivers transistors from damage caused by ESD events. Further modifications and alternative embodiments of various aspects of the invention will be apparent to those skilled in the art in view of this description. For example, although the devices are specifically discussed in reference to protection from ESD events, the devices may additionally or alternatively be used to protect against other excessive voltage events. It is intended that the following claims be interpreted to embrace all such modifications and changes and, accordingly, the drawings and the specification are to be regarded in an illustrative rather than a restrictive sense.

What is claimed is:

1. A circuit, comprising:
   an output driver transistor; and
   a distinct device configured to provide electrostatic discharge (ESD) protection for the output driver transistor, wherein the distinct device comprises:
   a single ESD protection transistor with an extended drain contact region;
   a silicon controlled rectifier (SCR) comprising:
   a first terminal spaced apart from the extended drain contact region of the ESD protection transistor, wherein the first terminal is enveloped within a first terminal well region, the first terminal well region comprising a well edge disposed between the first terminal and the extended drain contact region such that the extended drain contact region is laterally spaced apart from the first terminal well region; and
   a second terminal dually serving as a source contact region of the ESD protection transistor;
   an ohmic contact region spaced apart from the first terminal of the SCR; and
   a collection region arranged adjacent to the second terminal of the SCR, wherein the extended drain contact region is disposed within a second well region of the same conductivity type as both of the extended drain contact region and the first terminal well region, the second well region having a comparatively lower net concentration of electrically active components than the first terminal well region, and wherein the source contact region is disposed within a doped region of opposite conductivity type than the source contact region.

2. The circuit of claim 1, wherein the ESD protection transistor is configured to breakdown at a lower voltage than the output driver transistor.

3. The circuit of claim 1, wherein a distance between the extended drain contact region and the first terminal of the SCR at least partially affects the holding voltage of the SCR.

4. The circuit of claim 1, wherein a distance between the ohmic contact region and the first terminal of the SCR at least partially affects the triggering voltage of the SCR.

5. The circuit of claim 1, wherein a first distance between the extended drain contact region and the first terminal of the SCR is different than a second distance between the ohmic contact region and the first terminal.

6. The circuit of claim 1, wherein a first spacing between the first terminal of the SCR and the extended drain contact region and a second spacing between the ohmic contact region and the first terminal of the SCR each range between approximately 0.5 microns and approximately 10 microns.

7. The circuit of claim 1, wherein the output driver transistor is a pull-down output driver transistor, and wherein the distinct device and the output driver transistor are coupled in parallel to an input/output pad of the circuit.

8. The circuit of claim 1, wherein the output driver transistor is a pull-up output driver transistor, and wherein the distinct device is coupled between relatively high and low voltage power supplies.

9. A circuit, comprising:
   a laterally diffused output driver transistor; and
   a distinct device configured to provide electrostatic discharge (ESD) protection for the laterally diffused output driver transistor, wherein the distinct device comprises:
   a drain extended metal oxide semiconductor (DEMOS) transistor, wherein an extended drain contact region of the DEMOS transistor is encompassed within a first well region having a lower net concentration of electrically active components of the same conductivity type as the extended drain contact region;
   a silicon controlled rectifier (SCR) comprising:
   a first terminal spaced apart from the extended drain contact region of the DEMOS transistor, wherein the first terminal of the SCR is further disposed within a second well region having a same conductivity type as the first well region but a comparatively higher net concentration of electrically active components than the first well region; and
   a second terminal dually serving as a source contact region of the DEMOS transistor;
   an ohmic contact region spaced apart from the first terminal of the SCR which is distinct from the extended drain contact region, wherein the first terminal of the SCR and the ohmic contact region are encompassed within the first well region; and
   a collection region arranged adjacent to the second terminal of the SCR.

10. The circuit of claim 9, wherein the laterally diffused output driver transistor is a pull-down output driver transistor, and wherein the distinct device and the laterally diffused output driver transistor are coupled in parallel to an input/output pad of the circuit.

11. The circuit of claim 9, wherein the laterally diffused output driver transistor is a pull-up output driver transistor, and wherein the distinct device is coupled between relatively high and low voltage power supplies.

12. The circuit of claim 9, wherein the second well region is enveloped by the first well region.

13. The circuit of claim 12, wherein the ohmic contact region is not encompassed by the second well region.

14. The circuit of claim 13, wherein the ohmic contact region is encompassed by the first well region.

15. The circuit of claim 1, wherein the second well region envelopes the first terminal well region.

16. The circuit of claim 15, wherein the ohmic contact region is not encompassed by the first terminal well region.

17. The circuit of claim 16, wherein the ohmic contact region is encompassed by the second well region.

* * * * *